United States Patent
Tian et al.

(10) Patent No.: US 8,273,210 B2
(45) Date of Patent: Sep. 25, 2012

(54) PLASMA PROCESSING APPARATUS AND METHOD FOR ADJUSTING PLASMA DENSITY DISTRIBUTION

(75) Inventors: Caizhong Tian, Amagasaki (JP); Kiyotaka Ishibashi, Amagasaki (JP); Toshihisa Nozawa, Amagasaki (JP)

(73) Assignee: Tokyo Electron Limited (JP)

( * ) Notice: Subject to any disclaimer, the term of this patent is extended or adjusted under 35 U.S.C. 154(b) by 66 days.

(21) Appl. No.: 12/681,434

(22) PCT Filed: Oct. 2, 2008

(86) PCT No.: PCT/JP2008/067907
§ 371 (c)(1),
(2), (4) Date: May 4, 2010

(87) PCT Pub. No.: WO2009/044798
PCT Pub. Date: Apr. 9, 2009

(65) Prior Publication Data
US 2010/0252412 A1 Oct. 7, 2010

(30) Foreign Application Priority Data
Oct. 4, 2007 (JP) .................................. 2007-260550

(51) Int. Cl.
C23C 16/00 (2006.01)
C23F 1/00 (2006.01)
H01L 21/306 (2006.01)

(52) U.S. Cl. ......... 156/345.41; 156/345.36; 156/345.42; 118/723 MW; 118/723 R; 118/723 ME; 118/723 MA

(58) Field of Classification Search .......... 118/723 MW, 118/723 R, 723 ME, 723 AN; 156/345.41, 156/345.36, 345.42
See application file for complete search history.

(56) References Cited

U.S. PATENT DOCUMENTS

| 5,111,111 | A * | 5/1992 | Stevens et al. ........... 315/111.41 |
| 2003/0168008 | A1* | 9/2003 | Ohmi et al. .................... 118/715 |
| 2004/0261717 | A1* | 12/2004 | Ishii et al. .................... 118/723 I |
| 2006/0137613 | A1* | 6/2006 | Kasai .................... 118/723 MW |

FOREIGN PATENT DOCUMENTS

| JP | 2001-203098 | 7/2001 |
| JP | 2002-294460 | 10/2002 |
| JP | 2002-299314 | 10/2002 |
| JP | 2006-107994 | 4/2006 |
| JP | 2007-335346 | 12/2007 |

OTHER PUBLICATIONS

International Search Report—PCT/JP2008/067907 dated Jan. 6, 2009.

(Continued)

Primary Examiner — Rakesh Dhingra
(74) Attorney, Agent, or Firm — Cantor Colburn LLP

(57) ABSTRACT

In the plasma processing apparatus 1, microwaves supplied from a coaxial waveguide 30 are introduced into a processing container 2 via a wavelength-shortening plate 25, a process gas is plasmatized in the processing container 2, and a substrate W is processed using the plasma. In the plasma processing apparatus 1, a dielectric member 45 is disposed at a connecting area between the coaxial waveguide 30 and the wavelength-shortening plate 25. Inside an outer conductor 32 of the coaxial waveguide 30, the dielectric member 45 is disposed to surround a part of a circumference of an inner conductor 31 of the coaxial waveguide 30, and is disposed at any position around the circumference of the inner conductor 31.

17 Claims, 7 Drawing Sheets

OTHER PUBLICATIONS

Chinese Office Action—Chinese Application No. 200880110139.4 issued on Nov. 17, 2011, citing CN 1460287and CN 1460285.

Korean Office Action—Korean Application No. 10-2010-7007389 issued on Jan. 19, 2012, citing US 2003/0168008.

* cited by examiner

PLASMA PROCESSING APPARATUS AND METHOD FOR ADJUSTING PLASMA DENSITY DISTRIBUTION

TECHNICAL FIELD

The present invention relates to a plasma processing apparatus for generating plasma in a processing container and processing a substrate using the plasma, and a method of adjusting a plasma density distribution.

BACKGROUND ART

Plasma processing apparatuses that propagate microwaves from slots formed in a Radial Line Slot Antenna (RLSA) into a processing container and generate plasma are conventionally used in, for example, film formation or etching (for example, see Japanese Laid-Open Patent Publication No. 2006-107994). These RLSA-type plasma processing apparatuses are capable of forming uniform plasma having high density and a low electron temperature, and thus plasma-process large-sized semiconductor wafers uniformly and fast.

In the RLSA, a plurality of slot arrays each having a plurality of slots are arranged in concentric circles. The RLSA tries to uniformize plasma density generated in a processing chamber by adjusting an interval between adjacent slot arrays and the size of each of the slots.

DISCLOSURE OF THE INVENTION

Technical Problem

A conventional RLSA-type plasma processing apparatus achieves uniformization of plasma density in a radial direction of an RLSA, whereas uniformization of plasma density in a circumference direction of the RLSA is rarely considered. This is because, since the RLSA is disk-shaped and microwaves are radially propagated from a center of the RLSA, the condition for propagation of microwaves in the circumference direction of the RLSA is considered uniform. The other reasons may exist.

However, in some actual cases, plasma density generated within a processing chamber of the conventional RLSA-type plasma processing apparatus is not uniform not only in the radial direction of the RLSA but also in the circumference direction of the RLSA. An error in the shape of a device, a delicate gap between the RLSA and each of a wavelength-shortening plate and a transmission window respectively disposed on the top and bottom of the RLSA, or other factors may be considered as factors of the non-uniformity of the plasma density.

Accordingly, the present invention aims to adjust plasma density generated in a processing chamber of a plasma processing apparatus, particularly, in a circumference direction.

Technical Solution

According to an aspect of the present invention, there is provided a plasma processing apparatus in which microwaves supplied from a coaxial waveguide are introduced into a processing container via a wavelength-shortening plate, a process gas is plasmatized in the processing container, and a substrate is processed using the plasma, wherein a dielectric member is disposed at a connecting area between the coaxial waveguide and the wavelength-shortening plate; and inside an outer conductor of the coaxial waveguide, the dielectric member is disposed to surround a part of a circumference of an inner conductor of the coaxial waveguide, and is disposed at any position around the circumference of the inner conductor.

In the plasma processing apparatus, the dielectric member may be freely rotatable around the inner conductor. A part of the outer conductor may be formed of a ring which is freely rotatable, and the dielectric member may be attached to an inner surface of the ring.

According to another aspect of the present invention, there is provided a method of adjusting a plasma density distribution in a plasma processing apparatus in which microwaves supplied from a coaxial waveguide are introduced into a processing container via a wavelength-shortening plate, a process gas is plasmatized in the processing container, and a substrate is processed using the plasma, wherein at a connecting area between the coaxial waveguide and the wavelength-shortening plate, a dielectric member is disposed to surround a part of a circumference of an inner conductor of the coaxial waveguide, inside an outer conductor of the coaxial waveguide, in order to adjust the plasma density distribution around the circumference of the inner conductor.

In the method, the dielectric member may rotate around the inner conductor.

Advantageous Effects

According to the present invention, a dielectric member is disposed at a connecting area between a coaxial waveguide and a wavelength-shortening plate, so that plasma density generated in an area corresponding to the dielectric member may be lowered in a processing chamber of a plasma processing apparatus. The area corresponding to the dielectric member denotes an area into which microwaves passing through the dielectric member when microwaves are propagated from the coaxial waveguide into the wavelength-shortening plate are propagated in the processing chamber. In the processing chamber of the plasma processing apparatus, the microwaves passing through the dielectric member may be projected into the area corresponding to the dielectric member, so that plasma density may be lowered at this area than an area onto which microwaves not passing through the dielectric member are projected. Inside an outer conductor of the coaxial waveguide, the dielectric member may be disposed at any position around the circumference of an inner conductor of the coaxial waveguide, so that areas having high plasma density and areas having low plasma density may be formed in a circumference direction of the inner conductor. Accordingly, plasma density generated in the processing chamber of the plasma processing apparatus can be adjusted in the circumference direction of the inner conductor.

BEST MODE FOR CARRYING OUT THE INVENTION

Figure 1:
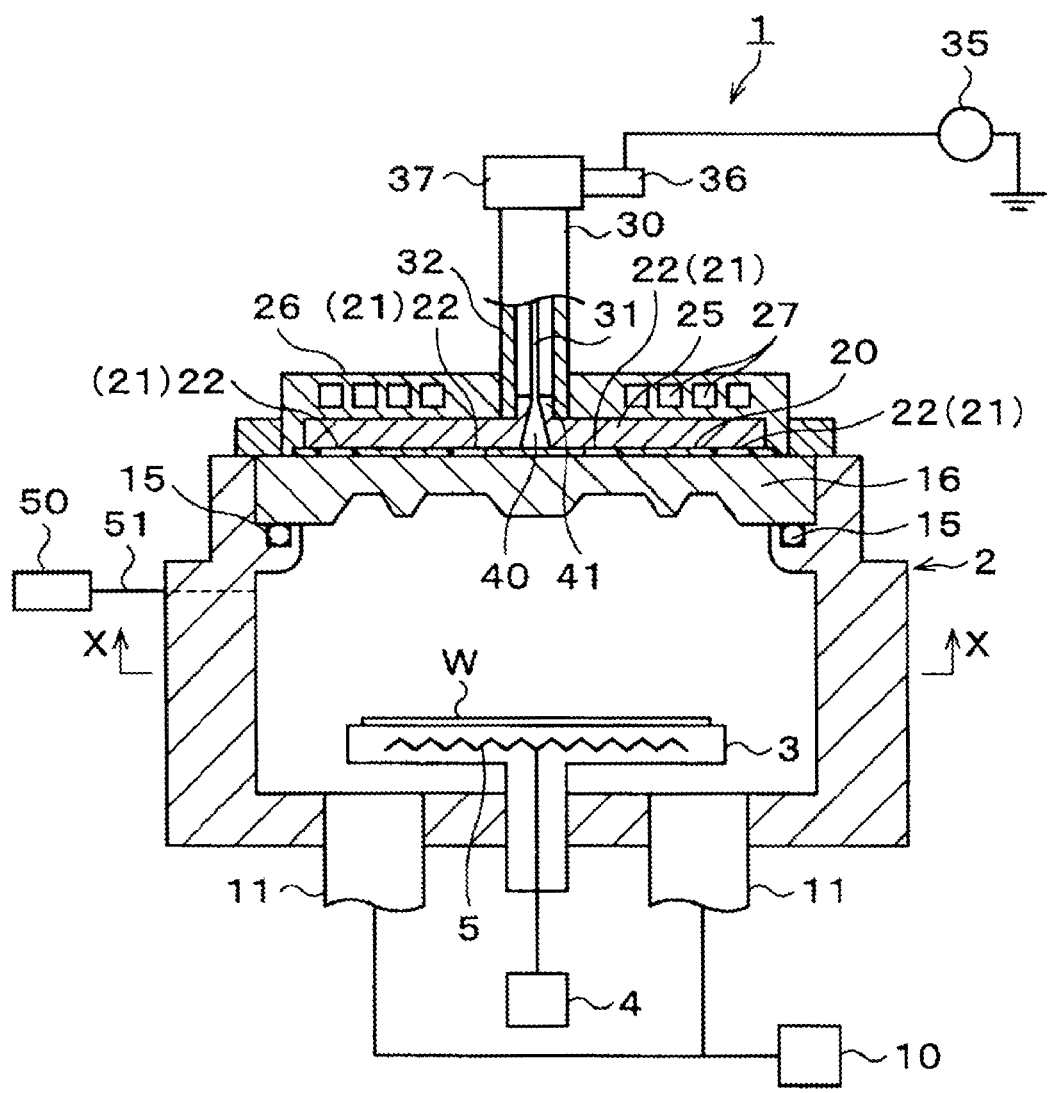
FIG. 1 is a longitudinal cross-section schematically illustrating a structure of a plasma processing apparatus according to an embodiment of the present invention.
Figure 2:
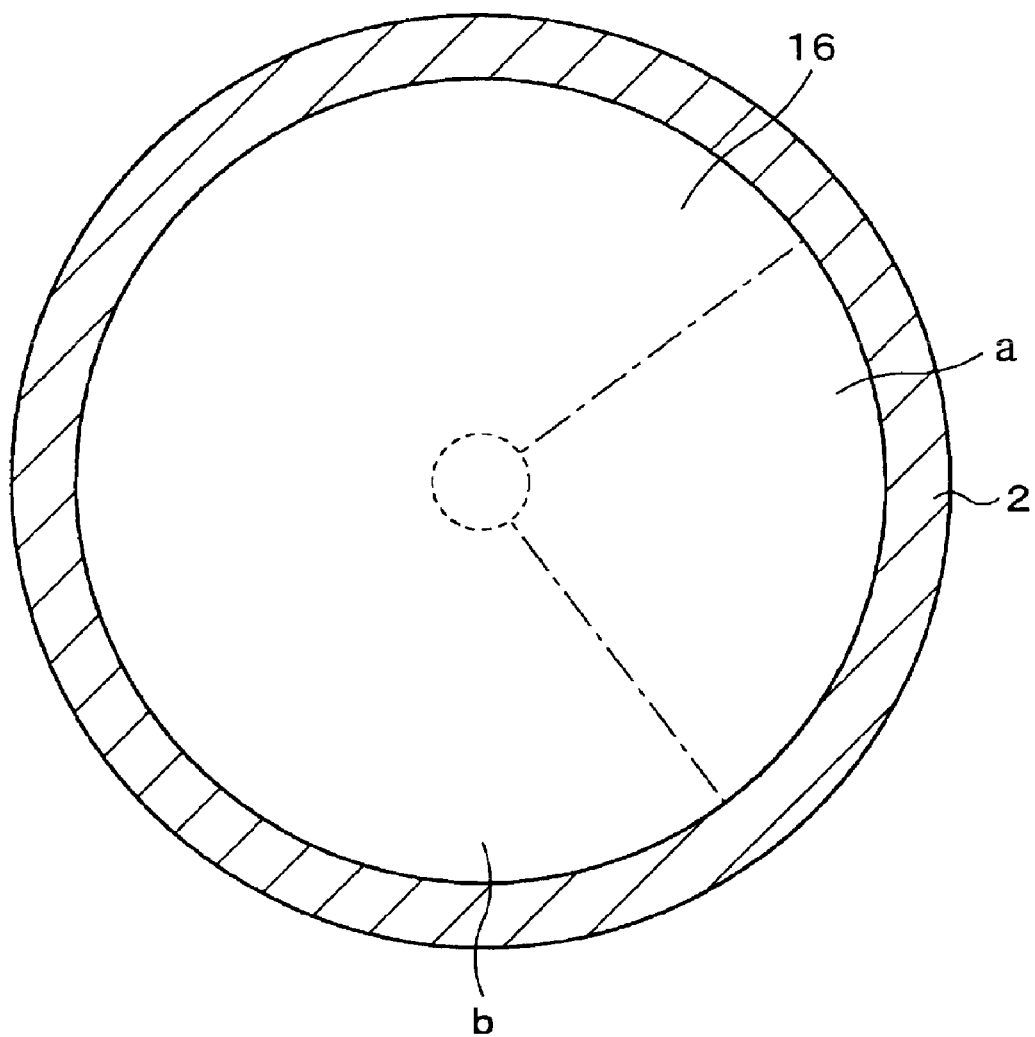
FIG. 2 is a cross-section taken along line X-X of FIG. 1.
Figure 3:
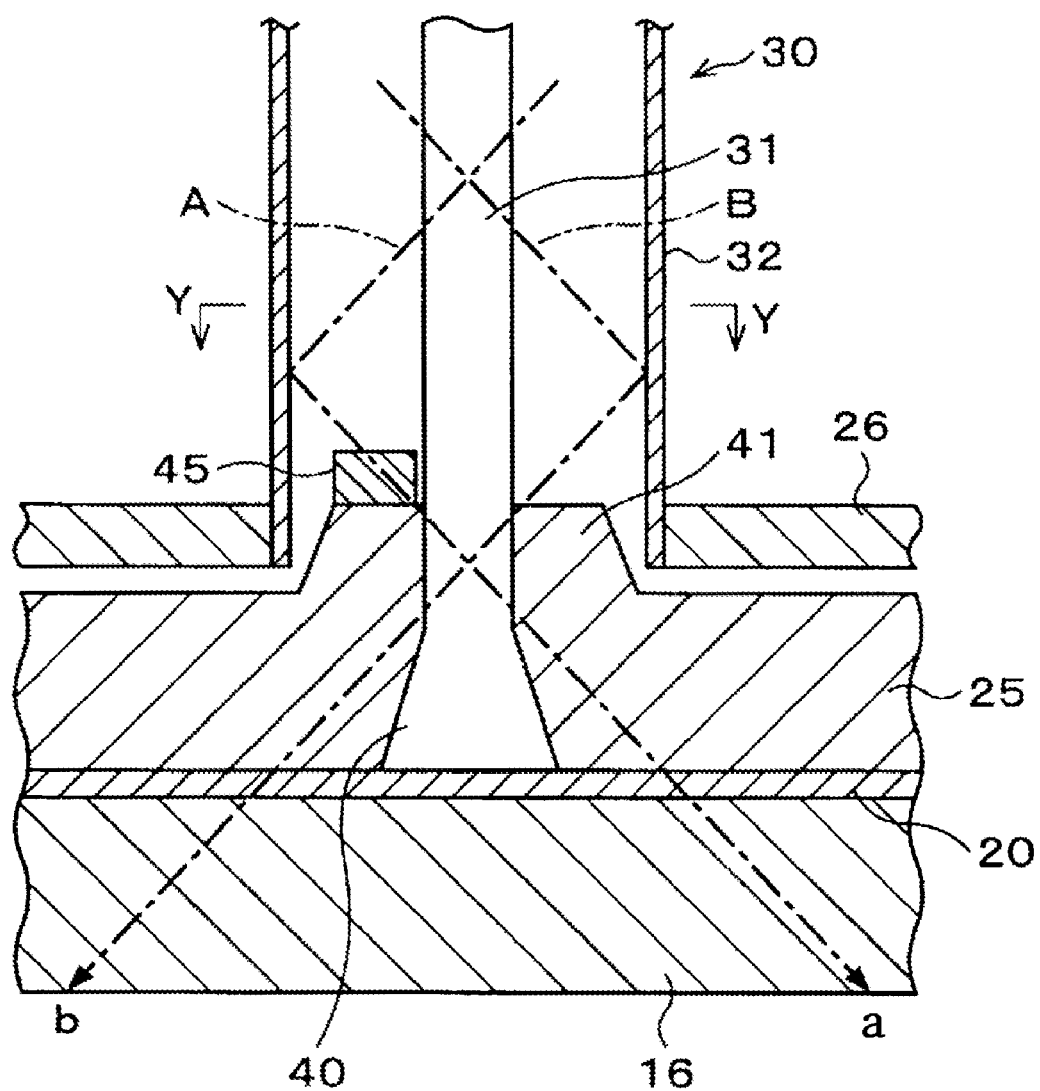
FIG. 3 is an enlarged view of a connecting area between a coaxial waveguide and a wavelength-shortening plate.
Figure 4:
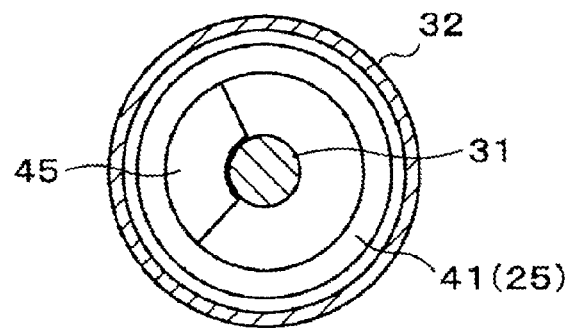
FIG. 4 is a cross-section taken along line Y-Y of FIG. 3.

The present invention will now be described more fully with reference to the accompanying drawings, in which exemplary embodiments of the invention are shown. FIG. 1 is a longitudinal cross-section schematically illustrating a structure of a plasma processing apparatus 1 according to an embodiment of the present invention. FIG. 2 is a cross-section taken along line X-X of FIG. 1, which illustrates a lower surface of a transmission window 16. FIG. 3 is an enlarged view of a connecting area between a coaxial waveguide 30 and a wavelength-shortening plate 25. FIG. 4 is a cross-section taken along line Y-Y of FIG. 3. Like reference numerals in the specification and drawings denote like elements, and thus their description will be omitted.

As illustrated in FIG. 1, the plasma processing apparatus 1 includes a processing container 2 which is formed of aluminum, for example, and has a cylindrical shape having an opening at the top and a closed lower surface. An inner wall surface of the processing container 2 is coated with a protective film, for example, alumina or the like. The processing container 2 is electrically grounded.

A susceptor 3, which functions as a holding stage for holding a substrate, for example, a semiconductor wafer (hereinafter, referred to as a wafer W), thereon, is disposed in a lower portion of the processing container 2. The susceptor 3 is formed of, for example, aluminum, and includes a heater 5 installed therein for emitting heat by receiving power from an external power source 4. Accordingly, the wafer W on the susceptor 3 may be heated to a predetermined temperature.

An exhaust pipe 11 through which the inside air of the processing container 2 is exhausted by an exhaust device 10, such as, a vacuum pump, is coupled to the lower portion of the processing container 2.

A transmission window 16 formed of a dielectric material, for example, quartz or the like, is disposed in the opening of an upper portion of the processing container 2 using a sealing member 15, such as an O ring for airtightness. As illustrated in FIG. 2, the transmission window 16 is approximately disk-shaped. Dielectric materials, for example, ceramic such as $Al_2O_3$, AlN, or the like, other than quartz may also be used to form the transmission window 16.

A planar antenna, for example, a Radial Line Slot Antenna (RLSA) 20 having a disk shape, is disposed above the transmission window 16. The RLSA 20 is formed of a thin copper circular plate plated or coated with a conductive material, for example, Ag, Au, or the like. A plurality of slot arrays 22 in which a plurality of slots 21 are disposed to form a circumference are arranged in the RLSA 20 to form concentric circles.

A wavelength-shortening plate 25 that has a disk shape and shortens the wavelength of microwaves, which will be described later, is disposed on an upper surface of the RLSA 20. The wavelength-shortening plate 25 is formed of a dielectric material, for example, $Al_2O_3$ or the like. Instead of $Al_2O_3$, other dielectric materials, for example, ceramic such as quartz, AlN, or the like, may be used to form the wavelength-shortening plate 25. The wavelength-shortening plate 25 is covered with a cover 26 which is conductive. Heat medium paths 27, each having an annular shape, are formed in the cover 26, and heat medium flowing through the heat medium paths 27 allows the cover 26 and the transmission window 16 to maintain a predetermined temperature.

A coaxial waveguide 30 is connected to a center of the cover 26. The coaxial waveguide 30 includes an inner conductor 31 and an outer conductor 32. The inner conductor 31 penetrates a center of the wavelength-shortening plate 25 and is then connected to a center of the upper surface of the RLSA 20. The slot arrays 22 formed in the RLSA 20 are arranged around the inner conductor 31 in concentric circles.

The microwave supply device 35 is connected to the coaxial waveguide 30 via a rectangular waveguide 36 and a mode converter 37. Microwaves of 2.45 GHz, for example, generated in the microwave supply device 35 are emitted to the transmission window 16 via the rectangular waveguide 36, the mode converter 37, the coaxial waveguide 30, the wavelength-shortening plate 25, and the RLSA 20. Energy of the microwaves emitted to the transmission window 16 enables an electric field to be generated on the lower surface of the transmission window 16, and thus plasma is generated within the processing container 2.

As illustrated in FIG. 3, a lower end 40 of the inner conductor 31 which is connected to the RLSA 20 is formed in a truncated cone shape. A truncated cone shaped protrusion 41 is formed at the center of an upper surface of the wavelength-shortening plate 25 such that the truncated cone shaped protrusion 41 protrudes upward from a lower end of the outer conductor 32. Since the lower end 40 of the inner conductor 31 has a truncated cone shape and the truncated cone shaped protrusion 41 is formed on the center of the upper surface of the wavelength-shortening plate 25 as described above, microwaves are efficiently propagated from the coaxial waveguide 30 to the wavelength-shortening plate 25 and the RLSA 20.

In a connecting area between the coaxial waveguide 30 and the wavelength-shortening plate 25, a dielectric member 45 is disposed on the wavelength-shortening plate 25. The dielectric member 45 is mounted on the truncated cone shaped protrusion 41 formed on the center of the upper surface of the wavelength-shortening plate 25. Inside the outer conductor 32 of the coaxial waveguide 30, the dielectric member 45 is not disposed to surround the entire circumference of the inner conductor 31 but is disposed in a fan shape to surround a part of the circumference of the inner conductor 31. In addition, the dielectric member 45 is not bound to the upper surface of the wavelength-shortening plate 25 (that is, the upper surface of the protrusion 41) and the outer circumference of the inner conductor 31. Accordingly, the dielectric member 45 can be disposed at a discretionary position around the circumference of the inner conductor 31 inside the outer conductor 32. Examples of a material used to form the dielectric member 45 may include ceramic, such as $Al_2O_3$, quartz, AlN, or the like, and Teflon. Although materials used to form the wavelength-shortening plate 25 and the dielectric member 45 are both dielectric materials, the dielectric materials used may not be the same, namely, may be different from each other.

Since the dielectric member 45 is disposed at the connecting area between the coaxial waveguide 30 and the wavelength-shortening plate 25 as described above, plasma density generated at an area corresponding to the dielectric member 45 may be reduced within a processing chamber of the plasma processing apparatus 1. In other words, when microwaves are propagated from the coaxial waveguide 30 to the wavelength-shortening plate 25, the RLSA 20, and the transmission window 16, since the dielectric member 45 is disposed around a part of the circumference of the inner conductor 31 as illustrated in FIG. 3, the microwaves follow a path "A" allowing microwaves to pass through the dielectric member 45 or a path "B" allowing microwaves not to pass through the dielectric member 45. Microwaves passing through the path "A" have energy decreased as much as the microwaves pass through the dielectric member 45, and thus an electric field formed on the lower surface of the transmission window 16 is relatively weak at a position "a" onto which the microwaves passing through the path "A" are projected (namely, an area corresponding to the dielectric member 45). As such, plasma density generated in the processing chamber is relatively low at the position "a" being the area corresponding to the dielectric member 45. On the other hand, microwaves passing through the path "B" are not subject to weaken in energy because they do not penetrate the dielectric member 45. Thus, an electric field formed on the lower surface of the transmission window 16 is relatively strong at a position "b" onto which the microwaves passing through the path "B" are projected (namely, an area onto which microwaves not passing through the dielectric member 45 are projected). As such, plasma density generated in the processing chamber is relatively high at the position "b" being the area onto which the microwaves not passing through the dielectric member 45 are projected. While microwaves are passing through the dielectric member 45, the dielectric member 45 is fixed to the wavelength-shortening plate 25 by means such as screws or adhesives.

As described above, inside the outer conductor 32 of the coaxial waveguide 30, the dielectric member 45 is formed in a fan shape to surround a part of the circumference of the inner conductor 31. Accordingly, as illustrated in FIG. 2, the position "a" being the area corresponding to the dielectric member 45 is formed in a fan shape on the lower surface of the transmission window 16.

A process gas is supplied from a gas supply source 50 into the processing container 2 via a path 51. A plasma generation gas, such as nitrogen, Ar, oxygen, or the like, a source gas such as TEOS, and the like are used as the process gas.

An operation of the plasma processing apparatus 1 having the above-described structure will now be described. Formation of an insulation film ($SiO_2$ film) on the wafer W by using a process gas including the plasma generation gas, such as Ar, oxygen, or the like, and the source gas, such as TEOS or the like, will be described as an example of plasma processing.

In the plasma processing apparatus 1, if a plasma film-formation process is performed, first, the wafer W is carried into the processing container 2 and held on the susceptor 3 as illustrated in FIG. 1. Exhaust through the exhaust pipe 11 is performed, and thus the inside of the processing container 2 is depressurized. The process gas including the plasma generation gas, such as Ar, oxygen, or the like and the source gas such as TEOS or the like is supplied from the gas supply source 50 into the processing container 2. According to an operation of the microwave supply device 35, an electric field is generated on the lower surface of the transmission window 16, and the process gas is plasmatized. At this time, radicals are generated, and a film is formed on the wafer W by the radicals.

After the film-formation process is performed for a predetermined period of time, the operation of the microwave supply device 35 and the supply of the process gas into the processing container 2 are stopped, and the wafer W is carried out of the processing container 2. In this way, a series of plasma film-formation processes are concluded.

In the above-described plasma processing apparatus 1, uniformization of plasma density not only in the radial direction but also in the circumference direction of the RLSA 20 is required so as to plasma-process, especially, a large wafer W, uniformly and fast.

In this case, shaping errors of the wavelength-shortening plate 25, the RLSA 20, the transmission window 16, and the like may be considered as a factor of preventing uniformization of plasma density in the circumference direction of the RLSA 20. In addition, although the wavelength-shortening plate 25, the RLSA 20, and the transmission window 16 are closely attached to one another, a fine gap is partly formed between the lower surface of the wavelength-shortening plate 25 and the upper surface of the RLSA 20 and between the lower surface of the RLSA 20 and the upper surface of the transmission window 16. Thus, in some cases, uniformization of plasma density in the circumference direction of the RLSA 20 is prevented. In particular, since the entire plasma processing apparatus 1 is heated during plasma processing, the wavelength-shortening plate 25, a fine gap may also be formed between the lower surface of the wavelength-shortening plate 25 and the upper surface of the RLSA 20 and between the lower surface of the RLSA 20 and the upper surface of the transmission window 16 due to a difference between thermal expansions of the RLSA 20 and the transmission window 16.

However, in the plasma processing apparatus 1, as described above, the dielectric member 45 is disposed on the wavelength-shortening plate 25 at the connecting area between the coaxial waveguide 30 and the wavelength-shortening plate 25, and the dielectric member 45 is disposed at any position around the circumference of the inner conductor 31 inside the outer conductor 32. Thus, inside the processing chamber of the plasma processing apparatus 1, plasma density generated at the area corresponding to the dielectric member 45 may be adjusted in the circumference direction.

In other words, if plasma density in an area around a part of the circumference of the RLSA 20 is relatively decreased during plasma processing, the dielectric member 45 is moved so that microwaves passing through the dielectric member 45 are projected into an area where plasma density is relatively increased and that microwaves not passing through the dielectric member 45 are projected into the area where plasma density is relatively decreased. As such, in the area where plasma density is relatively increased, an electric field generated on the lower surface of the transmission window 16 is relatively weakened. In this way, plasma density is adjusted in the circumference direction of the RLSA 20.

Accordingly, according to the plasma processing apparatus 1, plasma density generated in the processing chamber of the plasma processing apparatus 1 may be uniformized even in the circumference direction of the RLSA 20. Consequently, the plasma density generated in the processing chamber is entirely uniformized, and thus even large semiconductor wafers may be plasma-processed uniformly and fast.

While the present invention has been particularly shown and described with reference to the above-described embodiment thereof, it will be understood by those of ordinary skill in the art that various changes in form and details may be made therein without departing from the spirit and scope of the present invention as defined by the following claims.

Figure 5:
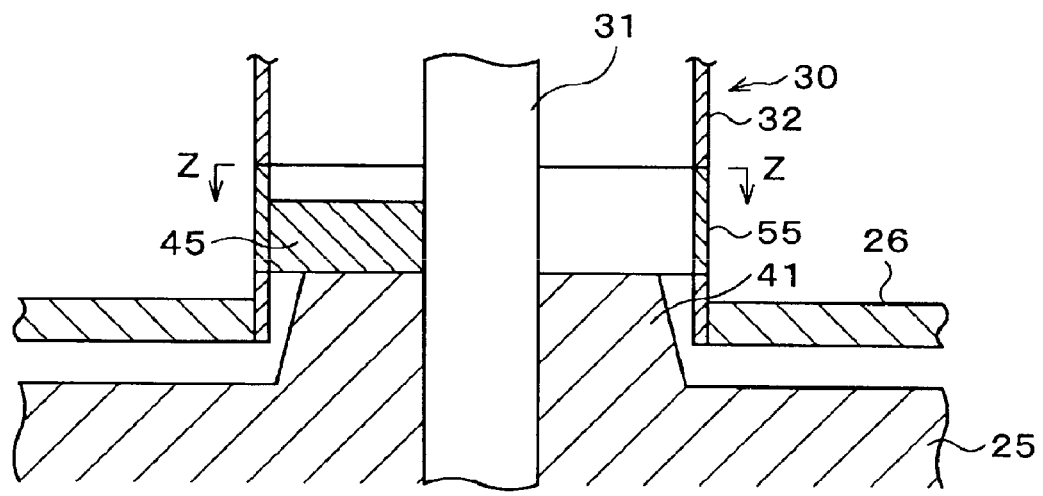
FIG. 5 is an enlarged view of a connecting area between a coaxial waveguide having an outer conductor of which a part is a freely-rotatable ring according to an embodiment of the present invention and a wavelength-shortening plate.
Figure 6:
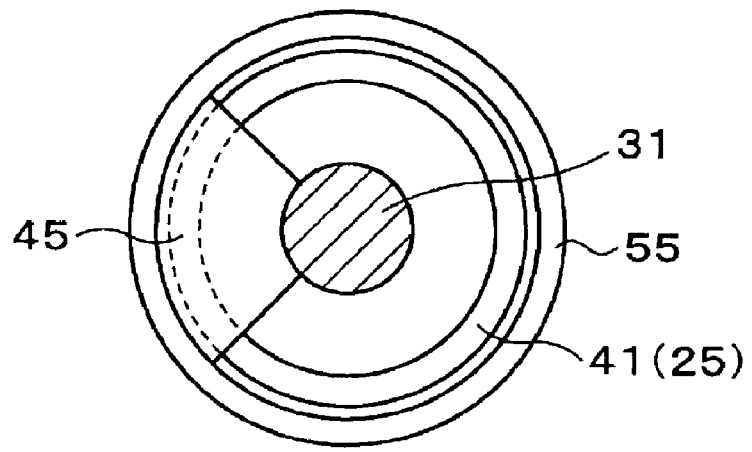
FIG. 6 is a cross-section taken along line Z-Z of FIG. 5.

For example, as illustrated in FIGS. 5 and 6, a part of the outer conductor 32 may be formed of a freely-rotatable ring 55, and the dielectric member 45 may be attached to an inner surface of the freely-rotatable ring 55. When the dielectric member 45 may be attached to the inner surface of the freely-rotatable ring 55 as described above, the dielectric member 45 may be moved discretionarily in the circumference direction of the inner conductor 31 inside the outer conductor 32 by rotating the freely-rotatable ring 55 on the outside of the coaxial waveguide 30. Accordingly, it is easy to adjust the plasma density in the circumference direction of the RLSA 20 is easy.

Figure 7:
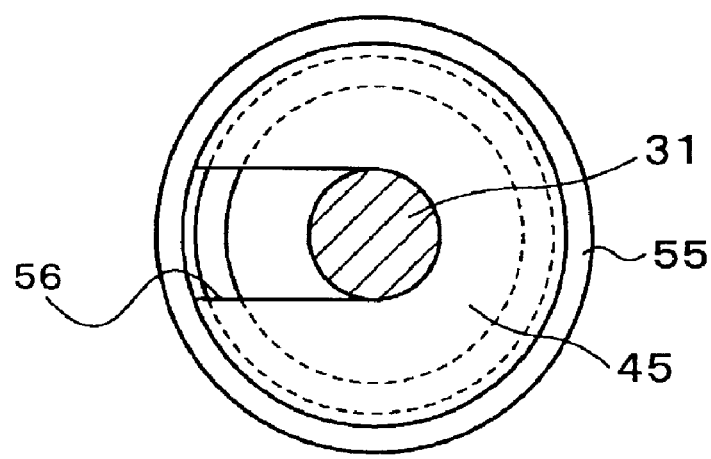
FIG. 7 illustrates a dielectric member having a gap formed in a part thereof.

The size of the dielectric member 45 may be any size as long as it does not surround the entire circumference of the inner conductor 31. For example, as illustrated in FIG. 7, a dielectric member 45 having a gap 56 formed in a part thereof may be considered. According to the dielectric member 45 of FIG. 7, the dielectric member 45 inside the outer conductor 32 is rotated by manipulating the ring 55, so that the gap 56 may be moved to any position around the circumference of the inner conductor 31. In an area corresponding to the gap 56, an electric field generated on the lower surface of the transmission window 16 is relatively increased as much as microwaves does not pass through the dielectric member 45. Thus, by changing the position of the gap 56 as described above, plasma density may also be adjusted in the circumference direction of the RLSA 20.

Figure 8:
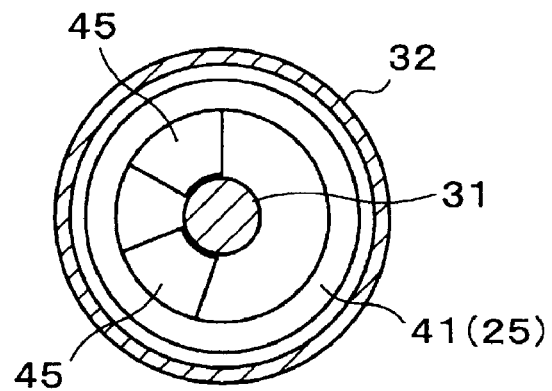
FIG. 8 illustrates an embodiment in which a plurality of dielectric members are disposed on a wavelength-shortening plate in a connecting area between a coaxial waveguide and the wavelength-shortening plate.

As illustrated in FIG. 8, at the connecting area between the coaxial waveguide 30 and the wavelength-shortening plate 25, a plurality of dielectric members 45 may be arranged on the wavelength-shortening plate 25 (the protrusion 41). Inside the outer conductor 32 of the coaxial waveguide 30, the dielectric members 45 are arranged at discretionary positions around the circumference of the inner conductor 31, so that a plurality of areas where plasma density is low may be formed in the circumference direction of the RLSA 20. Besides, inside the outer conductor 32 of the coaxial waveguide 30, apertures through which the dielectric members 45 are inserted may be formed in discretionary portions of the outer conductor 32 so that the dielectric members 45 may be arranged at any positions around the circumference of the inner conductor 31.

Figure 9:
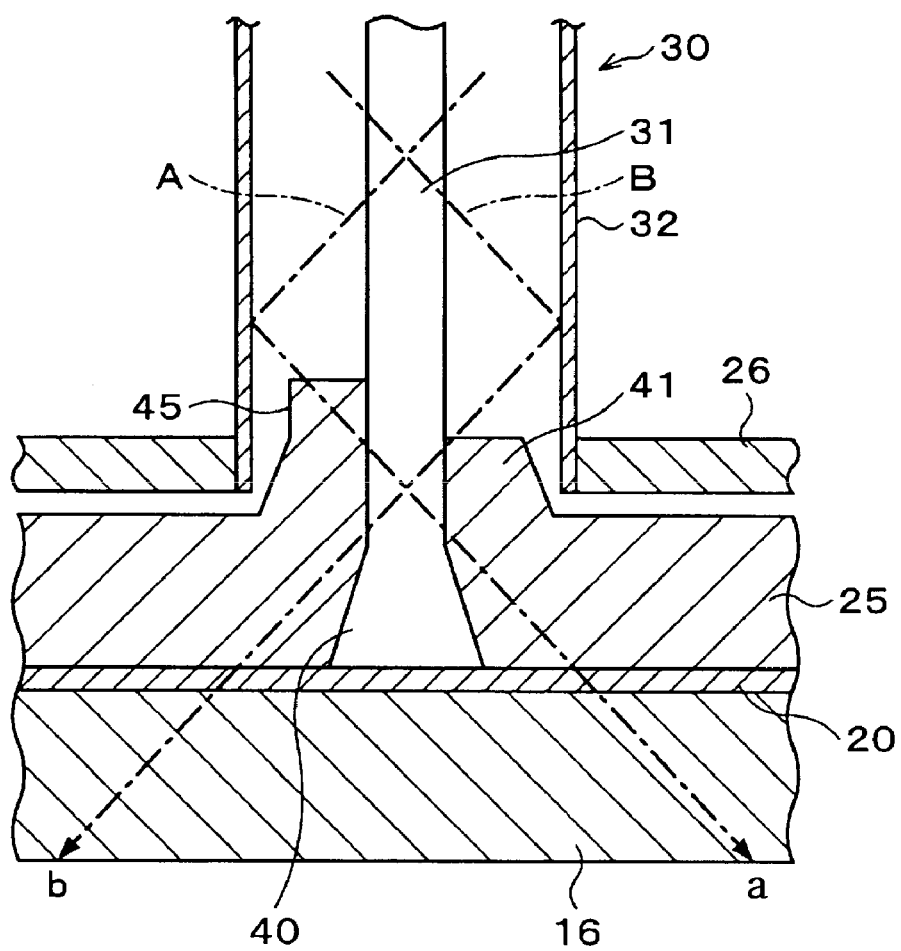
FIG. 9 illustrates an embodiment in which a wavelength-shortening plate and a dielectric member are integrally formed with each other.

Although the wavelength-shortening plate 25 and the dielectric member 45 are independent from each other and may be formed of different materials in the embodiment of FIG. 3, the present invention is not limited thereto. The wavelength-shortening plate 25 and the dielectric member 45 may be integrally formed with each other as illustrated in FIG. 9. In this case, fixation of the dielectric member 45 to the wavelength-shortening plate 25 by screws, adhesives, or the like when microwaves penetrate the dielectric member 45 as in the embodiment of FIG. 3 may not be performed, so that an increase in device operation efficiency is anticipated. In addition, in this case, the wavelength-shortening plate 25 and the dielectric member 45 may be formed of the same material, for example, ceramic such as $Al_2O_3$, quartz, AlN, or the like.

Although the present invention is applied to the plasma processing apparatus 1 for performing film-formation process in the above-described embodiments, the present invention is not limited thereto, and is applicable to plasma processing apparatuses that perform substrate processing, for example, etching. A substrate that is processed in a plasma processing apparatus according to the present invention may be a semiconductor wafer, an organic electroluminescent (EL) substrate, a flat panel display (FPD) substrate, or the like. For example, a slit array formed in an RLSA may be formed in a spiral shape.

MODE FOR INVENTION

Figure 10:
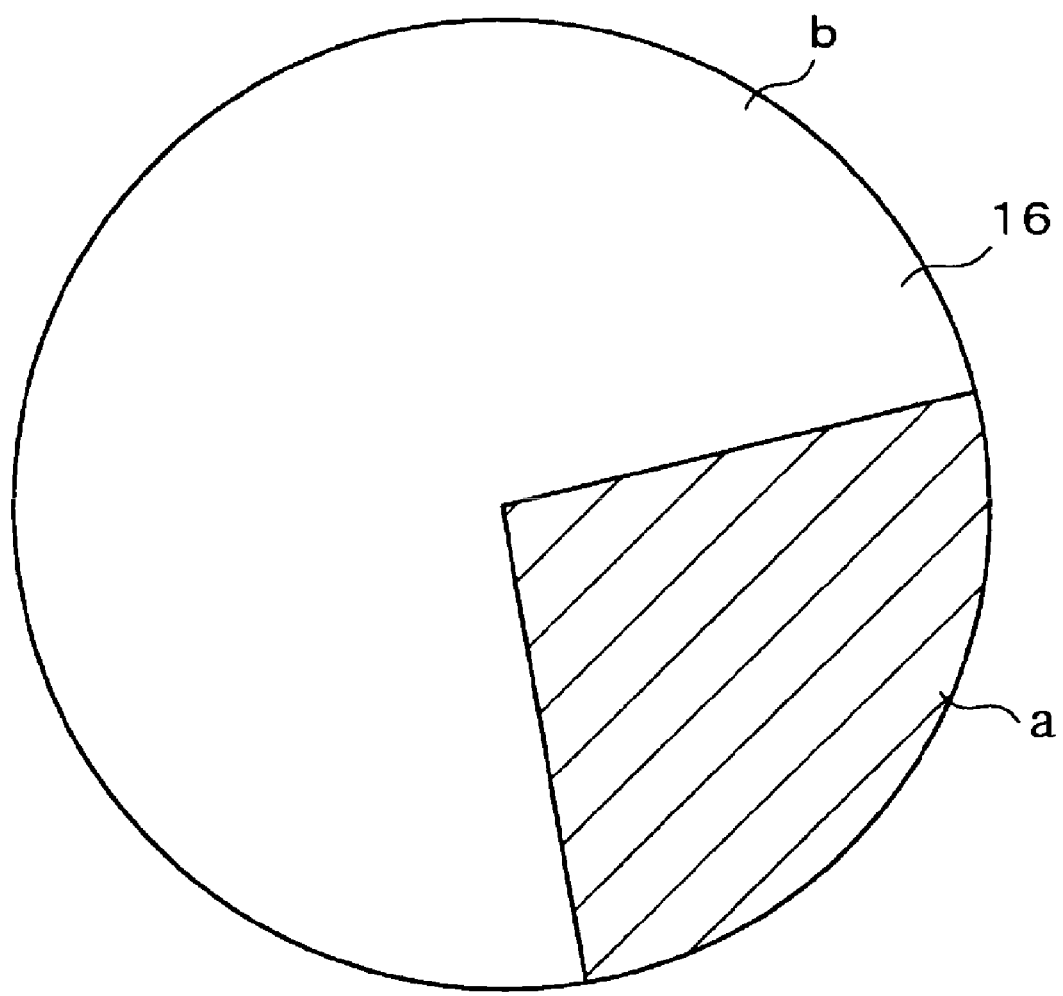
FIG. 10 is a diagram for explaining plasma density generated on a lower surface of a transmission window when a dielectric member is disposed in a connecting area between a coaxial waveguide and a wavelength-shortening plate.

As illustrated in FIGS. 3 and 4, when the dielectric member 45 is disposed in the connecting area between the coaxial waveguide 30 and the wavelength-shortening plate 25, the density of plasma generated on the lower surface of the transmission window 16 was measured. As a result, the lower surface of the transmission window 16 had a state shown in FIG. 10 and was darker at the area corresponding to the dielectric member 45 (namely, the position "a" onto which microwaves passing through the dielectric member 45 are projected) than at the area not corresponding to the dielectric member 45 (namely, the position "b" onto which microwaves not passing through the dielectric member 45 are projected). The plasma density was lower at the area corresponding to the dielectric member 45 (namely, the position "a" onto which microwaves passing through the dielectric member 45 are projected) than at the area not corresponding to the dielectric member 45 (namely, the position "b" onto which microwaves not passing through the dielectric member 45 are projected).

INDUSTRIAL APPLICABILITY

The present invention is applicable to plasma processing in which plasma is generated in a processing container and a substrate is processed using the plasma.

The invention claimed is:
1. A plasma processing apparatus in which microwaves supplied from a coaxial waveguide having an inner conductor and an outer conductor are introduced into a processing container via a wavelength-shortening plate, a process gas is plasmatized in the processing container, and a substrate is processed using the plasma,
   wherein a dielectric member is disposed on the wavelength-shortening plate at a connecting area between the coaxial waveguide and the wavelength-shortening plate; and
   the dielectric member on the wavelength-shortening plate is disposed to surround a part of a circumference of the inner conductor and can be moved to and disposed at any position around the circumference of the inner conductor.

2. The plasma processing apparatus of claim 1, wherein the dielectric member is freely rotatable around the inner conductor.

3. The plasma processing apparatus of claim 2, wherein the outer conductor further comprises a ring which is rotatable, and the dielectric member is attached to an inner surface of the ring.

4. The plasma processing apparatus of claim 1, wherein the dielectric member is ceramic or Teflon.

5. The plasma processing apparatus of claim 4, wherein the ceramic is one of $Al_2O_3$, quartz, and AlN.

6. The plasma processing apparatus of claim 1, wherein the dielectric member and the wavelength-shortening plate are integrally formed.

7. The plasma processing apparatus of claim 1, wherein the dielectric member and the wavelength-shortening plate are formed of the same material.

8. The plasma processing apparatus of claim 1, wherein a plurality of dielectric members are disposed on the wavelength-shortening plate.

9. A plasma processing apparatus in which microwaves supplied from a coaxial waveguide having an inner conductor and an outer conductor are introduced into a processing container via a wavelength-shortening plate, a process gas is plasmatized in the processing container, and a substrate is processed using the plasma, wherein a dielectric member is disposed on the wavelength-shortening plate at a connecting area between the coaxial waveguide and the wavelength-shortening plate; and the dielectric member on the wavelength-shortening plate is disposed to surround a part of a circumference of the inner conductor, and can be moved to and disposed at any position around the circumference of the inner conductor, wherein the plasma density is lower at the area corresponding to the dielectric member than at the area not corresponding to the member.

10. A plasma processing apparatus comprising:
a processing container into which a wafer is carried;
  a gas path through which a gas is supplied into the processing container;
  a transmission window which is air-tightly disposed in an opening of an upper portion of the processing container using a sealing member and transmits microwaves;
  a planar antenna member which is disposed above the transmission window;
  a wavelength-shortening plate which is disposed on an upper surface of the planar antenna member and shortens the wavelength of the microwaves;
  a conductive cover which covers the wavelength-shortening plate;
  a coaxial waveguide which is connected to the cover and has an inner conductor and an outer conductor: and
  a dielectric member which surrounds a part of the circumference of the inner conductor, and is disposed on a part of the wavelength-shortening plate at a connecting area between the coaxial waveguide and the wavelength-shortening plate and can be moved to and disposed at any position along and around a circumference of the inner conductor.

11. The plasma processing apparatus of claim 10, wherein the dielectric member is ceramic or Teflon.

12. The plasma processing apparatus of claim 11, wherein the ceramic is one of $Al_2O_3$, quartz, and AlN.

13. The plasma processing apparatus of claim 10, wherein the dielectric member and the wavelength-shortening plate are integrally formed.

14. The plasma processing apparatus of claim 10, wherein the dielectric member and the wavelength-shortening plate are formed of the same material.

15. The plasma processing apparatus of claim 10, wherein a plurality of dielectric members are disposed on the wavelength-shortening plate.

16. The plasma processing apparatus of claim 10, wherein a protrusion is formed at the center of an upper surface of the wavelength-shortening plate such that the protrusion extends upward from a lower end of the outer conductor.

17. The plasma processing apparatus of claim 16, wherein the protrusion is formed in a truncated cone shape.

* * * * *